United States Patent
D'Abreu et al.

(10) Patent No.: US 8,838,883 B2
(45) Date of Patent: Sep. 16, 2014

(54) SYSTEM AND METHOD OF ADJUSTING A PROGRAMMING STEP SIZE FOR A BLOCK OF A MEMORY

(75) Inventors: Manuel Antonio D'Abreu, El Dorado Hills, CA (US); Dimitris Pantelakis, Santa Clara, CA (US); Stephen Skala, Fremont, CA (US)

(73) Assignee: Sandisk Technologies Inc., Plano, TX (US)

(*) Notice: Subject to any disclaimer, the term of this patent is extended or adjusted under 35 U.S.C. 154(b) by 132 days.

(21) Appl. No.: 13/446,206

(22) Filed: Apr. 13, 2012

(65) Prior Publication Data

US 2013/0275651 A1 Oct. 17, 2013

(51) Int. Cl.
- *G06F 12/00* (2006.01)
- *G11C 11/56* (2006.01)
- *G11C 16/10* (2006.01)
- *G11C 16/34* (2006.01)

(52) U.S. Cl.
CPC ............ *G11C 11/5628* (2013.01); *G11C 16/10* (2013.01); *G11C 16/3431* (2013.01)
USPC ................... 711/103; 711/106; 711/E12.008; 714/704

(58) Field of Classification Search
CPC . G11C 11/5628; G11C 16/10; G11C 16/3431
USPC .................................. 711/103, 106; 714/704
See application file for complete search history.

(56) References Cited

U.S. PATENT DOCUMENTS

| | | | |
|---|---|---|---|
| 6,151,246 A | 11/2000 | So et al. | |
| 7,796,440 B2 | 9/2010 | Lee | |
| 7,821,827 B2 | 10/2010 | Kim | |
| 2003/0107919 A1 | 6/2003 | Yano et al. | |
| 2003/0151950 A1 | 8/2003 | Tamada et al. | |
| 2008/0148115 A1 | 6/2008 | Sokolov et al. | |
| 2009/0043951 A1* | 2/2009 | Shalvi et al. | 711/103 |
| 2010/0271874 A1* | 10/2010 | Mokhlesi et al. | 365/185.02 |
| 2011/0194353 A1 | 8/2011 | Hwang et al. | |
| 2012/0236653 A1* | 9/2012 | Spessot et al. | 365/185.19 |

OTHER PUBLICATIONS

The International Search Report and Written Opinion of the International Searching Authority mailed Aug. 21, 2013 in International Application No. PCT/US2013/034160, 11 pages.

* cited by examiner

*Primary Examiner* — Aracelis Ruiz
(74) *Attorney, Agent, or Firm* — Toler Law Group, PC

(57) ABSTRACT

A method includes decreasing a programming step size from a first value to a second value for a block of a memory device. The programming step size is decreased at least partially based on determining that an error count corresponding to the block satisfies a threshold.

20 Claims, 4 Drawing Sheets

SYSTEM AND METHOD OF ADJUSTING A PROGRAMMING STEP SIZE FOR A BLOCK OF A MEMORY

FIELD OF THE DISCLOSURE

The present disclosure is generally related to adjusting a programming step size for a block of a memory.

BACKGROUND

Non-volatile memory devices, such as universal serial bus (USB) flash memory devices or removable storage cards, have allowed for increased portability of data and software applications. Flash memory devices can enhance data storage density and cost efficiency by storing multiple bits in each flash memory cell.

Storing multiple bits of information in a single flash memory cell typically includes mapping sequences of bits to states of the flash memory cell. After determining that a sequence of bits is to be stored into a particular flash memory cell, the flash memory cell may be programmed to a state corresponding to the sequence of bits. Programming the flash memory cell with a small programming step size may increase programming accuracy but may increase a number of programming steps, thereby increasing programming latency. Programming the flash memory cell with a large programming step size may decrease the number of programming steps, thereby decreasing programming latency, but may decrease programming accuracy. Once the memory cells in the memory device have been programmed, data may be read from the memory cells by sensing the programming state of the memory cells.

SUMMARY

A size of a programming step for a block of a memory in a data storage device is decreased at least partially based on determining that an error count corresponding to the block satisfies a threshold. As a result, a tighter distribution of threshold voltages written to storage elements of the block using the decreased programming step size may be achieved, enabling programming data to the block with reduced errors. A "young" memory typically experiences fewer errors than an "old" memory. As a result, a block of a young memory may be programmed with a large programming step size. Programming the block with a large programming step size may decrease the number of programming steps, thereby decreasing programming latency. As the memory ages, the number of errors associated with data read from the storage elements within the block typically increases. Programming the block with a decreased programming step size in response to an error count reaching a threshold as the memory ages may increase accuracy, reduce errors, and prolong the life of the memory.

DETAILED DESCRIPTION

Systems and methods of decreasing a programming step size from a first value to a second value for a block of a memory in a data storage device are disclosed. The programming step size is decreased at least partially in response to determining that an error count corresponding to the block has reached a threshold. Decreasing the programming step size may enable programming data to the block with reduced errors by generating a tighter distribution of threshold voltages written to storage elements of the block (e.g., as the memory ages).

Figure 1:
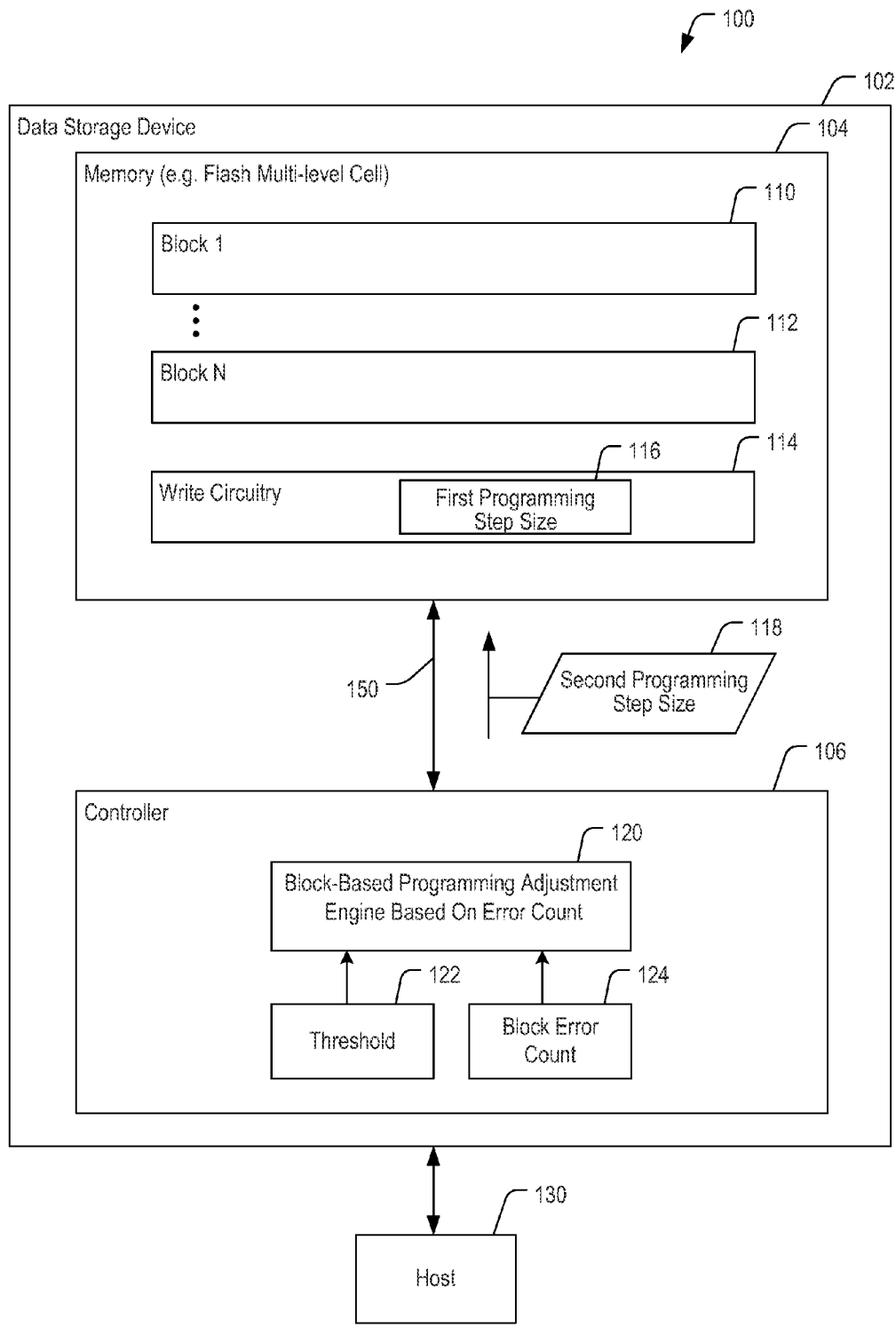
FIG. 1 is a block diagram of a first illustrative embodiment of a system to decrease a programming step size from a first value to a second value for a block of a memory device at least partially based on an error count corresponding to the block.

Referring to FIG. 1, a particular illustrative embodiment of a system configured to decrease a programming step size from a first value to a second value for a block of a memory device at least partially based on an error count corresponding to the block is depicted and generally designated 100. The programming step size may also be based on a number of memory reads that have been performed at the block, a number of write/erase cycles of the block, or a combination thereof. The system 100 includes a data storage device 102 coupled to a host device 130. The data storage device 102 includes a memory 104 coupled to a controller 106 via a bus 150.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD memory, as illustrative examples.

The memory 104 may be a non-volatile memory of a flash device, such as a NAND flash device, a NOR flash device, or any other type of flash device. The memory 104 includes a plurality of blocks, such as a first representative block 110 and a second representative block 112. The memory 104 further includes write circuitry 114 configured to program data to one or more of the blocks 110, 112 according to a programming step size. For example, the write circuitry 114 may program data to one or more of the blocks 110, 112 via a sequence of programming pulses having a programming step size, such as a first programming step size 116, as described in further detail with respect to FIG. 2. The write circuitry 114 may be configured to store the first programming step size 116 as a default programming step size. The write circuitry 114 may be configured to receive and use another programming step size, such as a second programming step size 118, from the controller 106 in place of the default programming step size. For example, the write circuitry 114 may be configured to program first data to the block 110 according to the first programming step size 116 and may be configured to program second data to the block 112 according to the second programming step size 118 (e.g., when the controller 106 writes data to the block 112 and sends the second programming step size 118 to the write circuitry 114 to perform such write operation). Thus the controller 106 may select the programming step size for data to be written to the memory via the write circuitry 114 on a block-by-block basis.

The controller 106 may be configured to receive memory access requests from the host device 130 and to process data read from the memory 104. The controller 106 includes a block-based programming adjustment engine 120 configured to receive a threshold 122 and a block error count 124. The block-based programming adjustment engine 120 may be configured to adjust a programming step size used by the write circuitry 114 at least partially based on the received threshold 122 and the received block error count 124. The block-based programming adjustment engine 120 may compare the threshold 122 and the block error count 124, and based on the result the block-based programming adjustment engine 120 may select the second programming step size 118. For example, if the block error count 124 is less than the threshold 122, the second programming step size 118 may not be selected. If the block error count 124 is greater than the threshold 122, the second programming step size 118 may be selected to be provided to the memory 104. The second programming step size 118 may be computed based on the first programming step size 116 or may be selected from a table, as described with respect to FIG. 3.

The controller 106 may be configured to decrease the programming step size from a first value to a second value for a block of the memory based on determining that an error count corresponding to the block satisfies a threshold. For example, an error count corresponding to the block 110 may increase as the memory 104 ages due to a number of memory reads of the block 110 or to a number of write/erase cycles of the block 110. When the error count (e.g., the block error count 124) corresponding to the block 110 satisfies a threshold (e.g., the threshold 122), a size of the programming step for the block 110 may be decreased from the first programming step size 116 to the second programming step size 118. To illustrate, the block-based programming adjustment engine 120 may determine to adjust programming step size from the first programming step size 116 to the second programming step size 118 based on a result of comparing the received threshold 122 and the received block error count 124. The controller 106 may send the second programming step size 118 to the write circuitry 114 for use in programming (i.e., writing data to) the block 110.

During operation, the host device 130 may instruct the controller 106 to read data corresponding to the block 110. The controller 106 may determine the block error count 124 based on the read data and may compare the block error count 124 to the threshold 122. If the block error count 124 satisfies the threshold 122, (e.g., the block error count 124 exceeds the threshold 122), a programming step size may be decreased from the first programming step size 116 to the second programming step size 118.

By decreasing the programming step size from a first value (e.g., the first programming step size 116) to a second value (e.g., the second programming step size 118) for a block of a memory device, the number of programming steps, and thus a programming latency, may increase. However, as described with respect to FIG. 2, data programmed to the block using a decreased programming step size will encounter reduced errors, prolonging the life of the memory device. Also, typically the programming step size will be decreased toward an end of a useful life of the memory device and latency will not increase during most of the life of the memory device.

Figure 2:
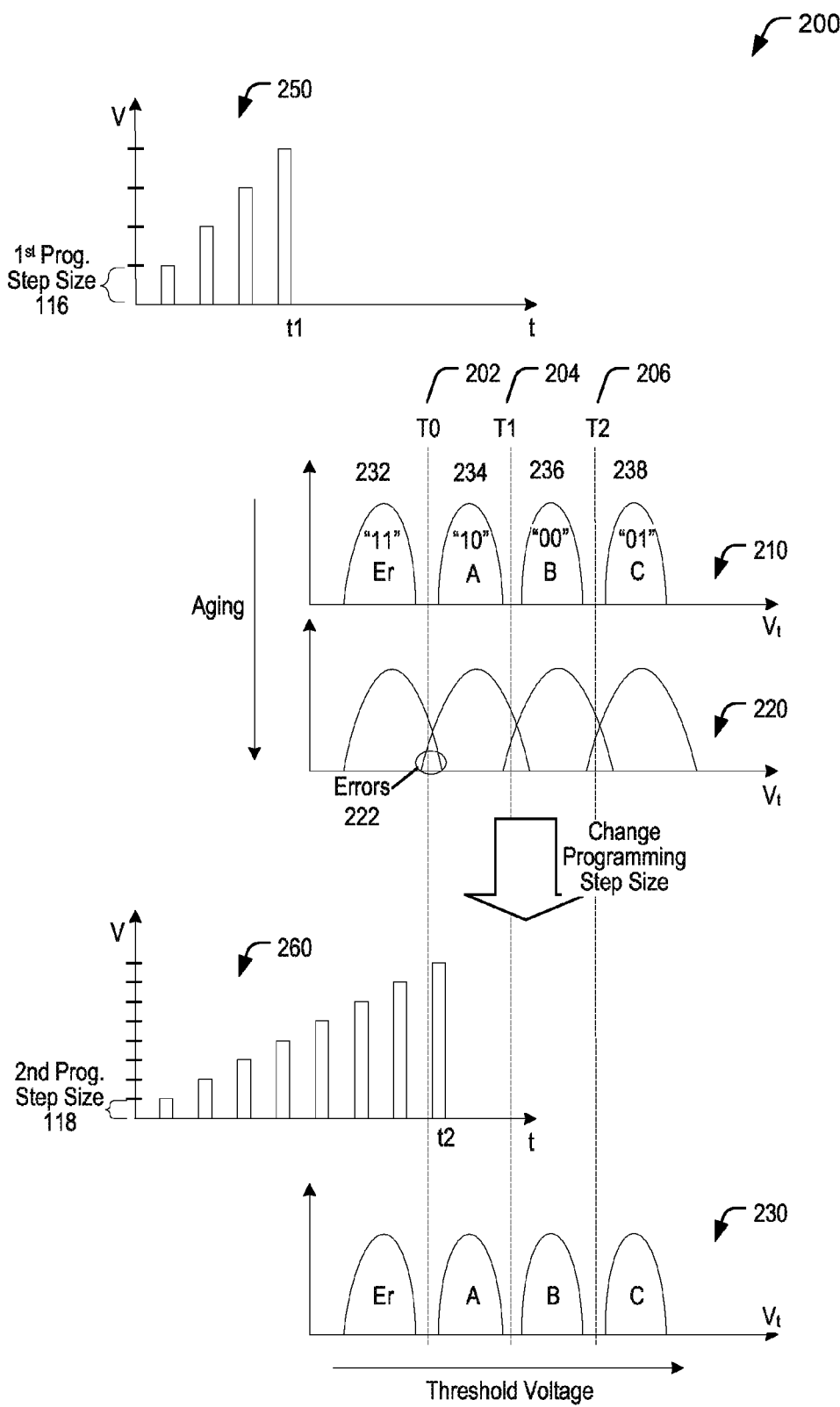
FIG. 2 is a general diagram illustrating representative voltage characteristics of a group of storage elements that may be read from a block of the memory of FIG. 1 and illustrating correction of bit errors by changing a programming step size.

FIG. 2 illustrates representative voltage characteristics 210, 220, and 230 of a group of storage elements that may be read from a block of a memory, such as the block 110 of FIG. 1, and illustrates an effect of decreasing programming step size to reduce data corruption due to overlap in voltage threshold distributions. For example, threshold voltage characteristics read from a group of multi-level cells, such as a 2-bit cell, is illustrated in a first cell voltage distribution (CVD) 210. The first CVD 210 illustrates a distribution of cells programmed to particular threshold voltages using a first programming step size. For example, a first graphical representation 250 illustrates a sequence of programming pulses having a programming step size, such as the first programming step size 116. The first programming step size 116 indicates a first voltage value. The sequence of programming pulses may program one or more blocks, such as the block 110, of the memory 104 of FIG. 1. As an illustrative example, four programming pulses are shown. Each successive programming pulse is increased in voltage value by the voltage value of the first programming step size 116. To illustrate, a third programming pulse may have a voltage value that is equal to the first voltage value added to a voltage value of a second programming pulse. As illustrated, programming the block 110 may include a first programming latency or delay t1.

As illustrated, the first CVD 210 includes four representative threshold voltage ranges defined by three read voltages T0 202, T1 204, and T2 206 and corresponding to cell states Er, A, B, and C, respectively. For example, a 2-bit value of '11' may correspond to a threshold voltage within a first threshold voltage range 232 corresponding to the "Er" state, a 2-bit value of '10' may correspond to a threshold voltage within a second threshold voltage range 234 corresponding to the "A" state, a 2-bit value of '00' may correspond to a threshold voltage within a third threshold voltage range 236 corresponding to the "B" state, and a 2-bit value of '01' may correspond to a threshold voltage within a fourth threshold voltage range 238 corresponding to the "C" state.

Data may be read from the storage elements by comparing cell threshold voltages to one or more of the read voltages T0-T2 202-206. The first CVD 210 is illustrated as having no errors (i.e., all cells remain in their originally programmed state). Although each cell may be initially programmed to have a threshold voltage at a center of its respective threshold voltage range, the actual cell threshold voltages may "drift" from a center voltage due to a variety of factors, such as a number of memory reads or a number of write/erase cycles of the block that the storage elements are within, resulting in the second CVD 220.

The second CVD 220 represents another threshold voltage characteristic that may be read from the group of multi-level cells at a later time than the first CVD 210 (e.g., as the memory ages). The CVD 220 illustrates a distribution of cells programmed to the particular threshold voltages using the first programming step size 116. An error region 222 includes errors that may occur in the storage elements of the block for cells originally programmed to states "Er" and "A", whose threshold voltage has drifted across the read voltage T0 202 into another state. To illustrate, errors may occur as the memory ages and may correspond to a number of memory reads or a number of write/erase cycles of the block that the storage elements are within. The errors may result from the threshold voltage of cells originally programmed to the "Er" state increasing beyond the read voltage T0 202 between the "Er" state and the "A" state as shown. Reading these cells using the read voltage T0 202 will cause the cells to be misidentified as being in the "A" state instead of in the "Er" state. The error region 222 also includes cells originally programmed to the "A" state whose threshold voltage has decreased below the read voltage T0 202. Reading these cells using the read voltage T0 202 will cause the cells to be misidentified as being in the "Er" state instead of in the "A" state.

Another representative threshold voltage characteristic read from the group of 2-bit multi-level cells of the second CVD 220 is illustrated in the third CVD 230, where the errors of the second CVD 220 have been avoided by a decrease in the programming step size used to program the cells to the particular threshold voltages, such as by the block-based programming adjustment engine 120 of FIG. 1. For example, a second graphical representation 260 illustrates a second sequence of programming pulses having a second programming step size that is decreased from the first programming step size 116, such as the second programming step size 118. The second programming step size 118 corresponds to a second voltage value that is less than the first voltage value. The block 110 may be programmed according to the second programming step size 118 as the memory 104 ages. As an illustrative example, eight programming pulses are shown. Each successive programming pulse is increased in voltage value by the second programming step size 118. As illustrated, programming the block 110 may include a second programming latency t2. The second programming latency t2 is greater than the first programming latency t1 due to an increased number of programming pulses.

In the third CVD 230, cells in the "Er" state that were misidentified as being in the "A" state when read with the read voltage T0 202 in the second CVD 220 are correctly identified as being in the "Er" state when read according to the third CVD 230 resulting from the decreased programming step size. Cells in the "A" state that were misidentified as being in the "Er" state when read with the read voltage T0 202 in the second CVD 220 are correctly identified as being in the "A" state when read according to the third CVD 230 resulting from the decreased programming step size.

By decreasing the programming step size of storage elements within a particular block of a memory, a tighter distribution of threshold voltages written to the storage elements of the particular block is achieved, enabling programming data to the block with reduced errors and prolonging the life of the memory.

Figure 3:
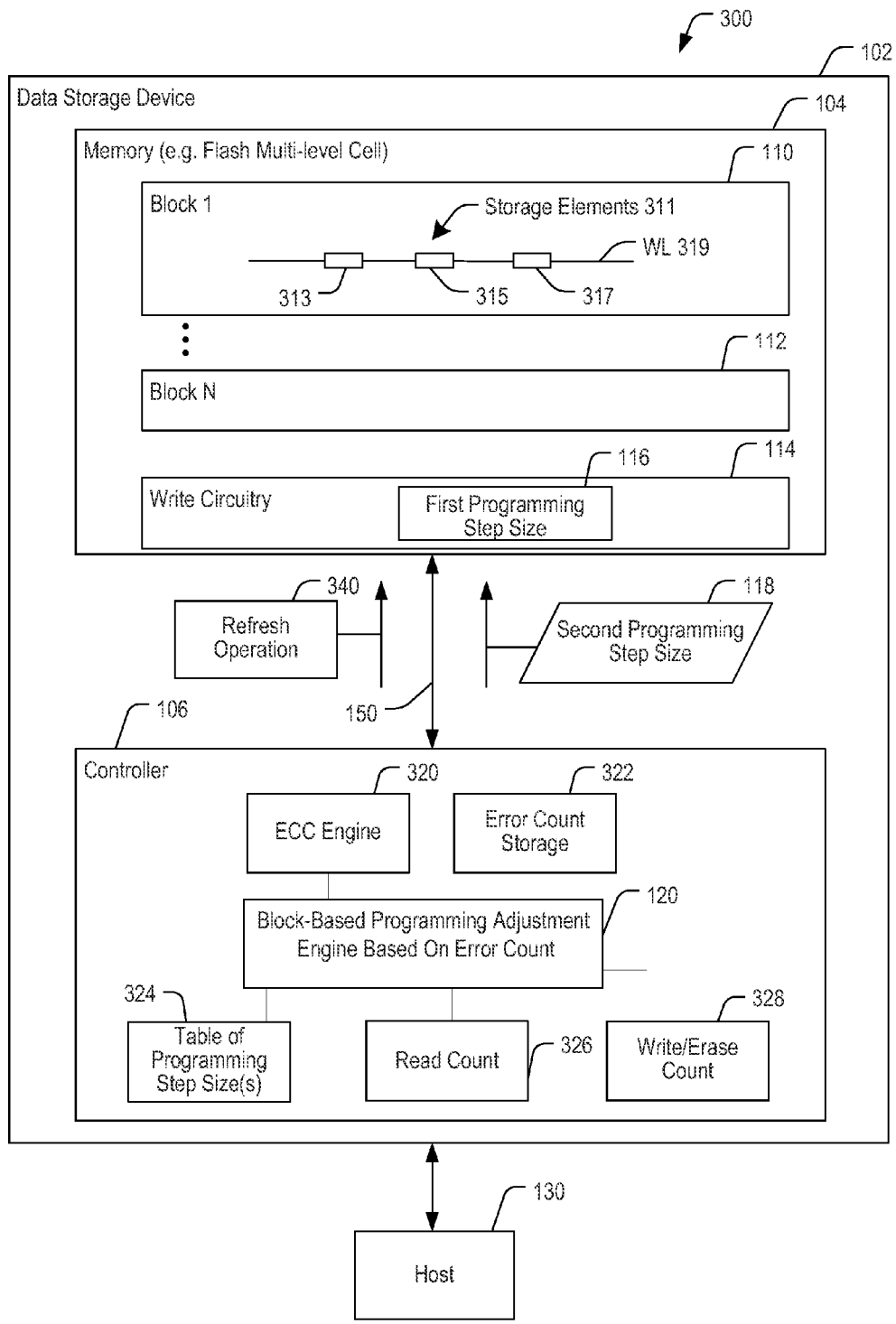
FIG. 3 is a block diagram of a second illustrative embodiment of a system to decrease a programming step size from a first value to a second value for a block of a memory device at least partially based on an error count corresponding to the block.

Referring to FIG. 3, a particular illustrative embodiment of the system of FIG. 1 showing additional detail of system components is depicted and generally designated 300. The system 300 includes the data storage device 102 coupled to the host device 130. The data storage device 102 includes the memory 104 coupled to the controller 106 via the bus 150.

The memory 104 includes multiple blocks including the first block 110 and the Nth block 112. The first block 110 includes a plurality of word lines, such as representative word line 319. Each word line includes a group of storage elements, such as the group of storage elements 311. The group of storage elements 311 may include multiple multi-level cell storage elements such as representative storage elements 313, 315, and 317 of a flash memory device. The memory 104 includes the write circuitry 114 and stores an indication of the first programming step size 116. For example, the write circuitry 114 may be configured to program first data to the block 110 according to the first programming step size 116 and may be configured to program second data to the block 112 according to the second programming step size 118 (e.g., when the controller 106 writes data to the block 112 and sends the second programming step size 118 to the write circuitry 114 to perform such write operation). Thus the controller 106 may select the programming step size for data to be written to the memory via the write circuitry 114 on a block-by-block basis.

The controller 106 includes the block-based programming adjustment engine 120. The controller 106 further includes an error correction code (ECC) engine 320 configured to perform a decoding operation and to provide data corresponding to a number of errors detected in the decoding operation to be stored in error count storage 322. For example, data read from the storage elements 311 within the block 110 may be received by the ECC engine 320. The ECC engine 320 may perform a decoding operation on the read data and may provide an error count based on the decoding operation to the block-based programming adjustment engine 120.

Error counts corresponding to blocks of the memory 104 that are provided to the block-based programming adjustment engine 120 may include a total number of errors detected in data read from the block 110 based on a summation of word line error counts of each word line of the block 110. An error count corresponding to the block 110 may increase as the memory 104 ages due to a number of reads of the word line 319 of the block 110, due to a number of write/erase cycles of the word line 319 of the block 110, due to one or more factors, or a combination thereof. A read count 326 may correspond to the number of memory reads that have been performed at the block 110 since a most recent erase of the block 110. A write/erase count 328 may correspond to the number of write/erase cycles of the block 110.

When the error count corresponding to the block 110 satisfies a threshold, a size of the programming step used when writing data to the block 110 may be decreased from the first programming step size 116 to the second programming step size 118. To illustrate, the block-based programming adjustment engine 120 may adjust the programming step size from a first value (e.g., the first programming step size 116) to a second value (e.g., the second programming step size 118) at least partially based on the received threshold and the received block error count.

The controller 106 may be configured to compute the second value based on the first value. For example, the second programming step size 118 may be computed based on a scaling factor multiplied by the first programming step size 116. To illustrate, the second programming step size 118 may be computed by multiplying the first programming step size 116 by a factor of 1.2 (e.g., the second value is 20% greater than the first value). In other implementations, the first programming step size 116 may be used as an index to retrieve the second programming step size 118 from a stored location, such as a table, a register, latches, etc.

The controller 106 may be configured to select the second value from a table of programming step size(s) 324. For example, the first value may be used as an index to retrieve the second value from the table of programming step size(s) 324. In other implementations, the second value may be selected from the table of programming step size(s) 324 based at least in part on a value of the block error count 124 of FIG. 1. To illustrate, if the value of the block error count 124 exceeds the threshold 122 by a large amount, the second value may be chosen from the table of programming step size(s) 324 such that the decrease from the first value is larger than the decrease would have been had the value of the block error count 124 exceeded the threshold 122 by a smaller amount. Although the table of programming step size(s) 324 is illustrated as within the controller 106, in other implementations, the table of programming step size(s) 324 may instead be within the memory 104.

The controller 106 may be configured to decrease the programming step size of the block 110 based on a comparison, at the controller 106, of a count of reads of the block 110 to a count of write/erase cycles of the block 110. For example, errors in a "newer" memory may be caused by read disturbance resulting from cells that are not being read receiving elevated voltage stress, causing cells in an erase state (i.e., state "Er" of FIG. 2) to be read as cells in a programmed state (i.e., state "A" of FIG. 2) rather than caused by the number of write/erase cycles of the block 110. In order to determine whether errors are due primarily to device aging or to read disturb, the controller 106 may compare the read count 326 to the write/erase count 328 and may decrease the programming step size from the first value to the second value if the result of the comparison of the read count 326 to the write/erase count 328 satisfies a threshold. Further, the controller 106 may be configured to, in response to a result of the comparison between the read count 326 and the write/erase count 328 satisfying a read disturb threshold, perform a refresh operation 340 at the block 110 instead of adjusting the programming step size. For example, if the read count 326 is relatively high, the write/erase count 328 is relatively low, and the error count satisfies the threshold, the errors may be largely due to read disturbance and the controller 106 may perform the refresh operation 340 (e.g., data is rewritten after reading) rather than decreasing the programming step size.

During operation, the host device 130 may instruct the controller 106 to read data corresponding to the block 110. The controller 106 may determine errors read from the word line 319 and may update the error count storage 322. For example, the controller may replace a prior number of errors read from the word line 319 with a new number of errors read from the word line 319.

The controller 106 may sum up the word line errors from the error count storage 322 for the block 110 (e.g., to determine the block error count 124 of FIG. 1) and compare the block error count 124 to the threshold 122. The comparison may be performed in a background process, or in response to a write request to the block 110. If the block error count 124 is greater than the threshold 122, the read count 326 may be compared to the write/erase count 328 to determine whether the errors may be due to read disturbance. If the comparison of the read count 326 and the write/erase count 328 indicates a likelihood of read errors, then the controller may perform the refresh operation 340. Otherwise, the controller 106 may send the second programming step size 118 to the memory 104 for use during a next write operation to the block 110.

Decreasing the programming step size of storage elements within a particular block of a memory enables programming data to the block with reduced errors and prolonging the life of the memory.

Figure 4:
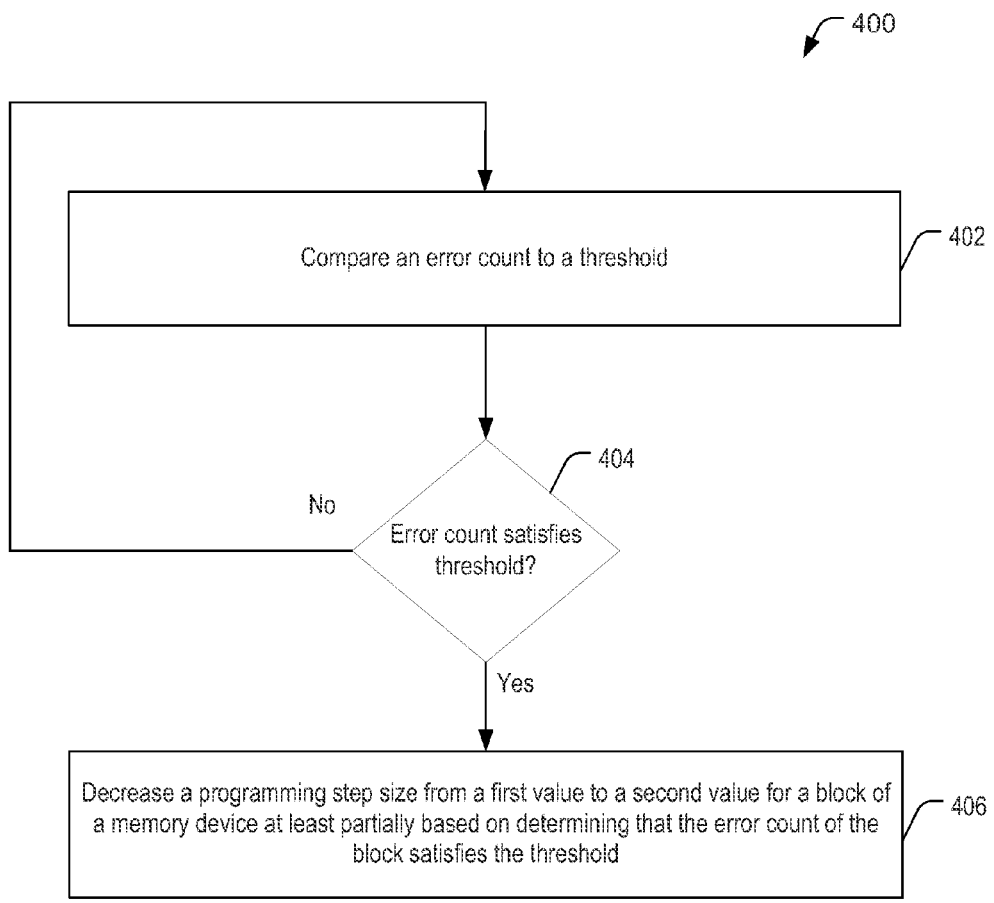
FIG. 4 is a flow diagram illustrating a particular embodiment of a method of decreasing a programming step size from a first value to a second value for a block of a memory device at least partially based on an error count corresponding to the block.

FIG. 4 depicts a flowchart that illustrates an embodiment of a method 400 of decreasing a programming step size from a first value to a second value for a block of a memory device. The method 400 may be performed by the data storage device 102 of FIG. 1 and FIG. 3.

An error count is compared to a threshold, at 402. To illustrate, the controller 106 may read data corresponding to the block 110 that has been programmed according to the first programming step size 116. The ECC engine 320 of FIG. 3 may perform a decoding operation on the data read and provide an error count for the word line 319. The error counts of all word lines of the block 110 may be combined to determine the block error count 124. The block error count 124 may be sent to the block-based programming adjustment engine 120 and may be compared to the threshold 122.

A determination is made whether the error count satisfies the threshold, at 404. If the error count does not satisfy the threshold, the method returns to 402. If the error count satisfies the threshold, a programming step size may be decreased from a first value to a second value for a block of a memory device at least partially based on determining that the error count of the block satisfies the threshold, at 406. To illustrate, the controller 106 may compare the block error count 124 to the threshold 122 and may decrease the programming step size based on a result of the comparison. Further, the controller 106 may, in response to the result of the comparison satisfying a read disturb threshold, perform the refresh operation 340 at the block 110 instead of adjusting the programming step size. For example, if the block error count 124 is greater than the threshold 122, the read count 326 may be compared to the write/erase count 328 to determine whether the errors may be due to read disturbance. If the read count 326 is greater than the write/erase count 328, then the controller may perform the refresh operation 340 rather than decreasing the programming step size. If the read count 326 is less than the write/erase count 328, then the controller 106 may send the second programming step size 118 to the memory 104 for use during a next write operation to the block 110.

Programming the block 110 with a large programming step size may decrease the number of programming steps, thereby decreasing programming latency. As the memory ages, the number of errors typically increases. Programming the block with a decreased programming step size as the memory ages may increase accuracy, reduce errors, and prolong the life of the memory.

Although various components depicted herein are illustrated as block components and described in general terms, such components may include one or more microprocessors, state machines, or other circuits configured to enable a data storage device, such as the data storage device 102 of FIG. 1 and FIG. 3, to perform the particular functions attributed to such components, or any combination thereof. For example, the controller 106 of FIG. 1 and FIG. 3 may represent physical components, such as controllers, processors, state machines, logic circuits, or other structures to instruct the block-based programming adjustment engine 120 to decrease a programming step size from a first value (e.g., the first programming step size 116) to a second value (e.g., the second programming step size 118).

The controller 106 may be implemented using a microprocessor or microcontroller programmed to generate control information and to instruct the block-based programming adjustment engine 120. In a particular embodiment, the controller 106 includes a processor executing instructions that are stored at the memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be a portable device configured to be selectively coupled to one or more external devices. For example, the data storage device 102 may be a removable device such as a universal serial bus (USB) flash drive or removable memory card. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   determining whether an error count corresponding to a block of a memory device is due to aging or to read disturbances;
   in response to determining that the error count is due to aging, decreasing a programming step size from a first value to a second value for the block; and
   in response to determining that the error count is due to read disturbances, performing a refresh operation on the block.

2. The method of claim 1, wherein decreasing the programming step size and increasing a number of programming steps enable programming data to the block with reduced errors by generating a tighter distribution of threshold voltages written to storage elements of the block.

3. The method of claim 1, wherein the block includes a plurality of word lines, each word line having a plurality of storage elements, and wherein the error count includes a total number of errors associated with data read from the storage elements within the word lines of the block.

4. The method of claim 1, further comprising selecting the second value from a table.

5. The method of claim 4, wherein the table is in a memory of the memory device.

6. The method of claim 4, wherein the table is in a controller of the memory device.

7. The method of claim 1, further comprising computing the second value based on the first value.

8. The method of claim 1, wherein determining whether an error count in the block is due to aging or to read disturbances is based on a comparison of a read count since a last erase of the block to a count of write/erase cycles of the block.

9. The method of claim 1, wherein the programming step size is decreased from the first value to the second value at least partially based on determining that the error count corresponding to the block is greater than a threshold.

10. The method of claim 1, wherein the memory device includes a flash memory.

11. A data storage device comprising:
    a memory; and
    a controller configured to:
    determine whether an error count corresponding to a block of the memory is due to aging or to read disturbances;
    in response to determining that the error count is due to aging, decrease a programming step size from a first value to a second value for the block; and
    in response to determining that the error count is due to read disturbances, perform a refresh operation on the block.

12. The data storage device of claim 11, further comprising write circuitry configured to program data to the block according to the programming step size.

13. The data storage device of claim 11, further comprising a block-based programming adjustment engine configured to adjust the programming step size at least partially based on received threshold data and received error count data.

14. The data storage device of claim 13, further comprising an error correction code engine configured to perform a decoding operation on data read from the block and to provide the error count to the block-based programming adjustment engine.

15. The data storage device of claim 13, wherein the error count includes a total number of errors based on a summation of word line error counts of each word line of the block.

16. The data storage device of claim 11, wherein the controller is further configured to select the second value from a table.

17. The data storage device of claim 16, wherein the table is in the memory of the data storage device.

18. The data storage device of claim 16, wherein the table is in the controller of the data storage device.

19. The data storage device of claim 11, wherein determining whether an error count in the block is due to aging or to read disturbances is based on a comparison, at the controller, of a count of reads since a last erase of the block to a count of write/erase cycles of the block.

20. The data storage device of claim 19, wherein performing the refresh operation on the block is based on result of the comparison being greater than a read disturb error threshold.

* * * * *